United States Patent
Ogawa et al.

(10) Patent No.: US 7,923,516 B2
(45) Date of Patent: Apr. 12, 2011

(54) ONE LIQUID TYPE CYANATE-EPOXY COMPOSITE RESIN COMPOSITION, ITS HARDENED MATERIAL, MANUFACTURING METHOD THEREOF, AND MATERIALS FOR SEALING AND ADHESIVE AGENTS USING THE SAME

(75) Inventors: Ryo Ogawa, Saitama (JP); Mitsunori Ide, Saitama (JP); Shinsuke Yamada, Saitama (JP)

(73) Assignee: Adeka Corporation, Tokyo (JP)

( * ) Notice: Subject to any disclaimer, the term of this patent is extended or adjusted under 35 U.S.C. 154(b) by 0 days.

(21) Appl. No.: 12/682,052

(22) PCT Filed: Sep. 30, 2008

(86) PCT No.: PCT/JP2008/002727
§ 371 (c)(1),
(2), (4) Date: Apr. 8, 2010

(87) PCT Pub. No.: WO2009/047885
PCT Pub. Date: Apr. 16, 2009

(65) Prior Publication Data
US 2010/0210793 A1    Aug. 19, 2010

(30) Foreign Application Priority Data

Oct. 9, 2007  (JP) ................................ 2007-263371

(51) Int. Cl.
*C08K 3/22* (2006.01)
*C08L 63/02* (2006.01)
(52) U.S. Cl. .......................... 525/486; 523/428; 523/429
(58) Field of Classification Search ........................ None
See application file for complete search history.

(56) References Cited

FOREIGN PATENT DOCUMENTS

| JP | 53-75299 A | | 7/1978 |
|---|---|---|---|
| JP | 60-144371 A | * | 7/1985 |
| JP | 62-265323 A | | 11/1987 |
| JP | 8-12855 A | * | 1/1996 |
| JP | 9-291268 A | * | 11/1997 |
| JP | 10-45878 A | * | 2/1998 |
| JP | 2000-239627 A | * | 9/2000 |
| JP | 2001-506313 | | 5/2001 |
| JP | 2004-182851 A | | 7/2004 |

* cited by examiner

*Primary Examiner* — Robert Sellers
(74) *Attorney, Agent, or Firm* — Millen, White, Zelano & Branigan, P.C.

(57) ABSTRACT

The present invention is a cyanate-epoxy composite resin composition comprised of a cyanate ester resin (A), an epoxy resin (B), and a latent curing agent (C), characterized in that the latent curing agent (C) is composed of a modified polyamine (c1), a phenol resin (c2) and one or more kind of polycarboxylic acid (c3). The above modified polyamine (c1) is a modified polyamine, which is obtained by the reaction of polyamine compound (c1-1) with epoxy compound (c1-2), containing one or more amino group having an active hydrogen within a molecule.

16 Claims, No Drawings

ONE LIQUID TYPE CYANATE-EPOXY COMPOSITE RESIN COMPOSITION, ITS HARDENED MATERIAL, MANUFACTURING METHOD THEREOF, AND MATERIALS FOR SEALING AND ADHESIVE AGENTS USING THE SAME

FIELD OF THE INVENTION

The present invention relates to cyanate-epoxy composite resin composition, particularly to one liquid type cyanate-epoxy composite resin composition which is comprised of cyanate ester resin, epoxy resin and specific latent curing agent, and has not only excellent storage stability but also fast curing properties.

BACKGROUND OF THE INVENTION

An epoxy resin composition has excellent electrical performance and adhesion. Therefore, it is widely used in electrical and electronic fields.

In addition, if sufficient effects can not be obtained when a conventional epoxy resin is used alone or in combination, cyanate-epoxy composite resin compositions comprised of mixing epoxy resin with cyanate ester resin are commonly used as a high heat resistant resin composition, for sealing of semiconductor and for molding.

For example, liquid epoxy resin compositions used for sealing of semiconductor comprised of cyanate ester, epoxy resin, inorganic filler and dihydrazide compound etc. have already been proposed (Patent document 1). However, in this case there were disadvantages in that not only each curing agent for cyanate ester and epoxy resin is required respectively, but also a high temperature and long curing time are required for curing. Therefore, liquid epoxy resin composition having satisfactory performance has not been obtained yet.

It was also proposed (Patent document 2) to use an amine curing agent for a composite composition containing cyanate ester and epoxy resin. However, in this case, sufficient storage stability was not obtained.

Furthermore, the heat curable resin composition (Patent document 3), wherein a latent curing agent containing imidazole component was used for cyanate ester and epoxy resin, was proposed. However, in this case, the quantity of cyanate resin used should be limited from a viewpoint of obtaining sufficient storage stability. Therefore, liquid epoxy resin compositions having satisfactory performance have not been obtained yet.

Patent document 1: Japanese Unexamined Patent Publication Tokkai 2001-302767

Patent document 2: Japanese Unexamined Patent Publication Tokkai-sho 60-250026

Patent document 3: Japanese Unexamined Patent Publication Toku hyo 2001-506313

DISCLOSURE OF INVENTION

Problems to be Solved by the Invention

Therefore, the object of the present invention is to provide one liquid type cyanate-epoxy resin composition having not only excellent storage stability and curing properties but also high heat resistance properties in the hardened material of said composition.

Means to Solve the Problems

As a result of extensive studies, the inventors of the present invention have found that extremely good results are obtained when cyanate ester resin, epoxy resin, specific modified amine which has one or more amino group having an active hydrogen within a molecule, phenol resin and polycarboxylic acid are contained in the composition, thereby achieving the present invention.

Namely, the present invention is cyanate-epoxy composite resin composition comprised of a cyanate ester resin (A), an epoxy resin (B), and a latent curing agent (C), characterized in that the above latent curing agent (C) is composed of a modified polyamine (c1), a phenol resin (c2) and one or more kind of polycarboxylic acid (c3), and the above modified polyamine (c1) is a modified amine which has one or more amino group having an active hydrogen within a molecule; a hardened material characterized in that it is obtained by curing and polymerizing the present one liquid type cyanate-epoxy composite resin composition; a sealing material and an adhesive agent characterized in that the present one liquid type cyanate-epoxy composite resin composition is contained therein; and a method of manufacturing a hardened material characterized in that curing and polymerization of the one liquid type cyanate-epoxy composite resin of the present invention are carried out inside the mold.

It is preferable that the above polyamine compound (c1-1) is at least one kind of polyamine compound selected from a group consisting of the diamine (1) having two primary or secondary amino groups different in reactivity within a molecule, and aromatic, alicyclic and aliphatic polyamine (2), which will be after-mentioned, having two or more primary or secondary amino groups within a molecule. Herein, the above polyamine (2) is the polyamine compound wherein the reactivity of the remaining primary or secondary amino groups with the epoxy group deteriorate by steric hindrance caused by the first reaction when one of the amino groups belonging to the above polyamine (2) reacts with an epoxy group.

It is preferable that the above modified polyamine (c1) is the one obtained by reacting 0.5-2 equivalent of the above phenol resin (c1-2) with 1 mol of the above polyamine compound (c1-1).

It is preferable that the quantity of the above phenol resin (c2) used is 10-100 mass parts relative to 100 mass parts of the above modified polyamine (c1), and the quantity of the above polycarboxylic acid (c3) used is 1-50 mass parts relative to 100 mass parts of the above modified polyamine (c1).

It is preferable that the above polyamine compound (c1-1) is at least one kind selected from 1,2-diaminopropane, isophoronediamine, methanediamine, m-xylylenediamine, 1,3-bis-aminocyclohexane and N-aminoethylpiperazine, and the above epoxy compound (c1-2) is a polyglycidyl ether compound having two or more epoxy groups within a molecule.

It is preferable that the quantity of the above epoxy resin (B) used is 1-10,000 mass parts relative to 100 mass parts of the above cyanate ester resin (A).

It is preferable that the above cyanate ester resin (A) is at least one kind of compounds selected from a group consisting of compounds represented by the following formula (1), compounds represented by the following formula (2) and prepolymers thereof.

$$N \equiv C - O - R^2 - R^1 - R^3 - O - C \equiv N \quad (1)$$

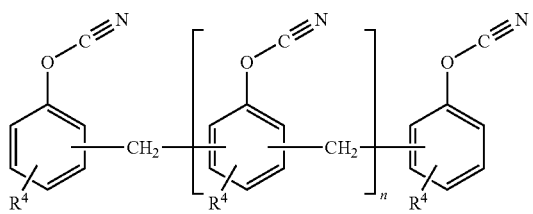

(2)

$R^1$ in the above formula (1) is an unsubstituted or fluorine-substituted divalent hydrocarbon, each of $R^2$ and $R^3$ are independently an unsubstituted phenylene group or a phenylene group substituted by 1~4 alkyl groups, n in the formula (2) is an integer of 1 or more, $R^4$ is a hydrogen atom or an alkyl group having 1-4 carbon atoms.

Another preferable cyanate ester resin (A) is at least one kind of compounds selected from a group consisting of compounds represented by the following formula (3) and prepolymers thereof.

(3)

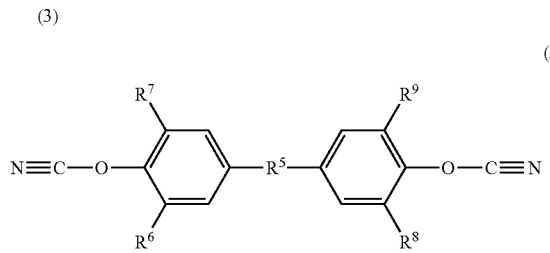

$R^5$ in the above formula is

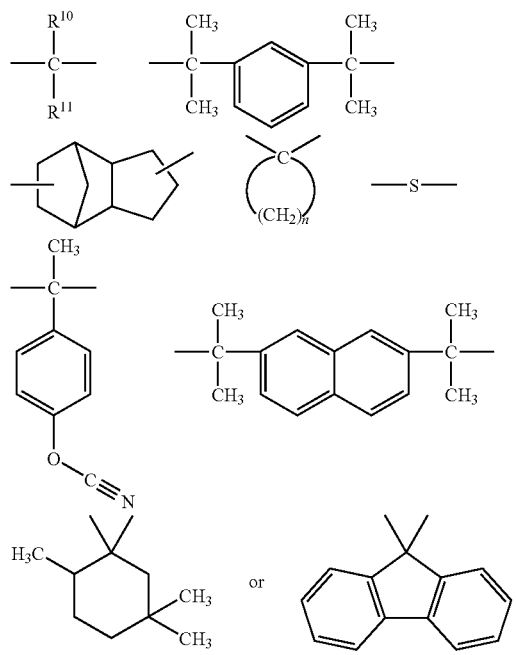

$R^6$, $R^7$, $R^8$ and $R^9$ are each independently a hydrogen atom, an unsubstituted or a fluorine-substituted methyl group, n is an integer of 4-12, $R^{10}$ and $R^{11}$ are each independently a hydrogen atom, an unsubstituted or a fluorine-substisuted methyl group.

EFFECTS OF THE INVENTION

One liquid type cyanate-epoxy resin composition having not only excellent storage stability but also fast curing properties and is able to use widely as a coating composition or as an adhesive agent for concrete, cement, mortar, various types of metal, leather, glass, rubber, plastic, wood, cloth and paper etc. can be obtained by the present invention. In addition, one liquid type cyanate-epoxy resin composition having high heat resistance and excellent adhesive properties in particular, which can be suitably used for sealing materials to protect semiconductors, electronic materials to bond electronic parts etc. and automobile materials, can be obtained by the present invention.

WORKING EMBODIMENT OF THE INVENTION

Now, one liquid type cyanate-epoxy resin composition of the present invention is described in detail.

Cyanate ester resin (A) used for one liquid type cyanate-epoxy resin composition of the present invention is not particularly limited, but examples of it are compounds represented by the following formula (1) or (2).

$$N\equiv C-O-R^2-R^1-R^3-O-C\equiv N \quad (1)$$

$R^1$ in the above formula (1) is an unsubstituted or fluorine-substituted divalent hydrocarbon, $R^2$ and $R^3$ are each independently an unsubstituted phenylene group or a phenylene group substituted by 1~4 alkyl groups.

(2)

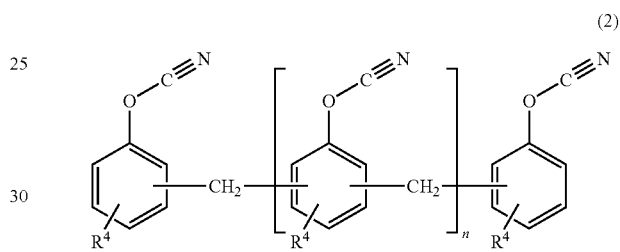

n in the above formula (2) is an integer of 1 or more, $R^4$ is a hydrogen atom or an alkyl group having 1~4 carbon atoms.

Furthermore, the prepolymers, wherein a part of cyanate group in the compound of the above formula (1) or (2) forms a triazine ring, can be used as the component (A). Examples of such prepolymers are trimers of all or a part of the compounds of formula (1).

Other than compounds represented by the above formulae (1) and (2), compounds represented by the following formula (3) or their prepolymers can be suitably used.

(3)

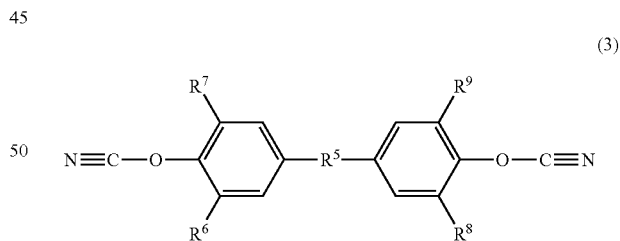

$R^5$ in the above formula (3) is

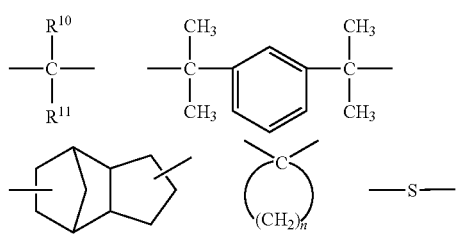

-continued

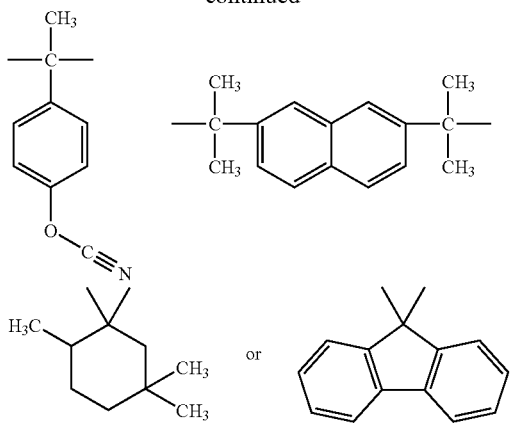

n is an integer of 4~12. $R^6$, $R^7$, $R^8$ and $R^9$ are each independently a hydrogen atom, or an unsubstituted or fluorine-substituted methyl group. $R^{10}$ and $R^{11}$ are each independently a hydrogen atom, or an unsubstituted or fluorine-substituted methyl group.

It is preferable in the present invention that 4,4'-ethylidenebisphenylenecyanate, 2,2-bis(4-cyanatephenyl) propane and bis(4-cyanate-3,5-dimethylphenyl)methane are used among them.

These cyanate ester resins may be used alone, or more than two kinds of them may be used in combination in the present invention.

Examples of epoxy resin (B) used for the present invention are, for examples, polyglycidyl ether compounds of mononuclear polyhydric phenol compounds such as hydroquinone, resorcin, pyrocatechol, phloroglucinol etc.; polyglycidyl ether compounds of polynuclear polyhydric phenol compounds such as dihydroxy naphthalene, bisphenol, methylenebisphenol(bisphenol F), methylene bis(orthocresol), ethylidene bisphenol, isopropylidene bisphenol (bisphenol A), isopropylidene bis(orthocresol), tetrabromobisphenol A, 1,3-bis(4-hydroxycumylbenzene), 1,4-bis(4-hydroxycumylbenzene), 1,1,3-tris(4-hydroxyphenyl)buthane, 1,1,2,2-tetra(4-hydroxyphenyl)ethane, thiobisphenol, sulfobisphenol, oxybisphenol, phenol novolac, orthocresol novolac, ethylphenol novolac, butylphenol novolac, octylphenol novolac, resorcin novolac, terpenephenol etc.; polyglycidyl ether compounds of polyhydric alcohols such as ethylene glycol, propylene glycol, butylene glycol, hexanediol, polyglycol, thiodiglycol, glycerine, trimethylol propane, pentaerythritol, sorbitol, bisphenol A-ethylene oxide addition compounds etc.; glycidyl esters of aliphatic, aromatic or alicyclic polybasic acid such as maleic acid, fumaric acid, itaconic acid, succinic acid, glutaric acid, suberic acid, adipic acid, azelaic acid, sebacic acid, dimer acid, trimer acid, phthalic acid, isophthalic acid, terephthalic acid, trimellitic acid, trimeric acid, pyromellitic acid, tetrahydrophthalic acid, hexahydrophthalic acid and endomethylene tetrahydrophthalic acid etc.; and homopolymer or copolymer of glycidyl methacrylate; epoxy compounds having glycidylamino groups such as N,N-diglycidyl aniline, his (4-(N-methyl-N-glycidylamino) phenyl)methane, diglycidyl ortho-toluidine etc.; epoxidized compounds of cyclic olefin compounds such as vinylcyclohexane diepoxide, dicyclopentanediene diepoxide, 3,4-epoxy cyclohexylmethyl-3,4-epoxycyclohexane carboxylate, 3,4-epoxy-6-methylcyclohexylmethyl-6-methylcyclohexane carboxylate, bis (3,4-epoxy-6-methylcyclohexylmethyl) adipate etc.; epoxidized conjugated diene polymers such as epoxidized polybutadiene, epoxidized styrene-butadiene copolymer etc.; a heterocyclic compound such as triglycidylisocyanurate. These epoxy resins may be internally cross-linked by prepolymers having terminal isocyanate or may be high-molecularized resins obtained by using polyhydric active hydrogen compounds (polyhydric phenol, polyamine, carbonyl group-containing compound and polyphosphate ester etc.)

It is preferable that the epoxy equivalent of polyepoxy compound (B) is 70~3,000, and 90~2,000 is more preferable. Curing properties may deteriorate when the epoxy equivalent is less than 70, on the other hand, sufficient physical properties of coating may not be obtained when the epoxy equivalent is more than 3,000.

The latent curing agent (C) used for the present invention is composed of a modified polyamine (c1), a phenol resin (c2) and one more kind of polycarboxylic acid (c3). The above modified polyamine (c1), which is a polyamine obtained by reacting a polyamine compound (c1-1) with an epoxy compound (c1-2), has one or more amino group having an active hydrogen within a molecule.

Examples of the above polyamine compound (c1-1) are aliphatic polyamines such as ethylenediamine, diethylene triamine, triethylenetetramine, tetraethylenepentamine, polyoxypropylenediamine, polyoxypropylenetriamine; alicyclic polyamines such as isophoronediamine, mensendiamine, bis (4-amino-3-methyldicyclohexyl)methane, diaminodicyclohexylmethane, his (aminomethyl)cyclohexane, N-aminoethylpiperazine, 3,9-bis(3-aminopropyl)-2,4,8,10-tetraoxaspiro (5,5) undecane; mononuclear polyamines such as m-phenylenediamine, p-phenylenediamine, tolylene-2,4-diamine, tolylene-2,6-diamine, mesitylene-2,4-diamine, mesitylene-2,6-diamine, 3,5-diethyltolylene-2,4-diamine, 3,5-diethyltolylene-2,6-diamine; aromatic polyamines such as biphenylenediamine, 4,4-diaminodiphenylmethane, 2,5-naphthylenediamine, 2,6-naphthylenediamine; an imidazole such as 2-aminopropyl imidazole.

In the present invention, the adhesive properties and physical properties etc. of hardened materials can be improved by using, in particular, the following diamine (1) and at least one kind of polyamine (2) selected from aromatic, alicyclic and aliphatic polyamines, as the polyamine compound (c1-1).

diamine (1): the diamine having two primary or secondary amino groups which respectively differ in reactivity within a molecule, polyamine (2): the polyamine which has two or more primary or secondary amino groups within a molecule and in which steric hindrance occurring by the reaction of one of them with an epoxy group deteriorates the reactivity of the remaining primary or secondary amino group with an epoxy group.

These diamines and polyamines can be used alone or two or more kinds of them can be used in combination in the present invention.

Examples of diamine corresponding to the above (1) are isophorondiamine, menthanediamine, 2,2,4-trimethylhexamethylenediamine, 2,4,4-trimethylhexamethylenediamine and 1,2-diaminopropane etc. Examples of diamine corresponding to the above (2) are m-xylylenediamine, 1,3-bisaminocyclohexane etc. The present invention is not to be limited to these.

Furthermore, it is preferable to use imidazole compounds containing a primary amino group such as 2-aminopropylimidazole as the above polyamine compound from a viewpoint of improving cure properties at low temperature.

Examples of epoxy compounds (c1-2) used for the present invention are monoglycidyl ether compounds such as phenylglycidyl ether, allylglycidyl ether, methylglycidyl ether, butylglycidyl ether, sec-butylglycidyl ether, 2-ethylhexylglycidyl ether, 2-methyloctylglycidyl ether, stearylglycidyl ether etc.; a monoglycidyl ester compound such as versatic acid glycidyl ester etc.; polyglycidyl other compounds of mononuclear polyhydric phenol compounds such as hydroquinone, resorcin, pyrocatechol, phloroglucinol etc.; polyglycidyl ether compounds of polynuclear polyhydric phenol compounds such as dihydroxy naphthalene, biphenol, methylenebisphenol (bisphenol F), methylenebis (orthocresol), ethylidene bisphenol, isopropylidene bisphenol (bisphenol A), isopropylidene bis(orthocresol), tetrabromo bisphenol A, 1,3-bis(4-hydroxy cumylbenzene), 1,4-bis(4-hydroxy cumylbenzene), 1,1,3-tris(4-hydroxyphenyl) buthane, 1,1,2, 2-tetra(4-hydroxyphenyl)ethane, thiobisphenol, sulfobisphenol, oxybisphenol, phenol novolac, orthocresol novolac, ethylphenol novolac, butylphenol novolac, octylphenol novolac, resorcin novolac, terpenephenol etc.; polyglycidyl ether compounds of polyhydric alcohols such as ethylene glycol, propylene glycol, butylene glycol, hexanediol, polyglycol, thiodiglycol, glycerine, trimethylol propane, pentaerythritol, sorbitol, bisphenol A-ethylene oxide addition compounds etc.; glycidyl esters of aliphatic, aromatic or alicyclic polybasic acid such as maleic acid, fumaric acid, itaconic acid, succinic acid, glutaric acid, suberic acid, adipic acid, azelaic acid, sebacic acid, dimer acid, trimer acid, phthalic acid, isophthalic acid, terephthalic acid, trimellitic acid, trimesic acid, pyromellitic acid, tetrahydrophthalic acid, hexahydrophthalic acid and endomethylene tetrahydrophthalic acid etc., and homopolymers or copolymers of glycidylmethacrylate; epoxy compounds having glycidylamino groups such as N,N-diglycidyl aniline, his (4-(N-methyl-N-glycidylamino) phenyl)methane, diglycidyl ortho-toluidine etc.; epoxidized compounds of cyclic olefin compounds such as vinylcyclohexene diepoxide, dicyclopentanediene diepoxide, 3,4-epoxycyclohexylmethyl-3,4-epoxycyclohexane carboxylate, 3,4-epoxy-6-methylcyclohexylmethyl-6-methylcyclohexane carboxylate, bis (3,4-epoxy-6-methylcyclohexylmethyl) adipate etc.; epoxidized conjugated diene polymers such as epoxidized polybutadiene, epoxidized styrene-butadiene copolymer etc.; a heterocyclic compound such as triglycidylisocyanurate etc.

In the present invention, it is preferable to use a polyglycidyl ether compound having two or more epoxy groups within a molecule. It is especially preferable to use a polyglycidyl ether of bisphenol compounds such as methylenebisphenol (bisphenol F), methylenebis (orthocresol), ethylidene bisphenol, isopropylidenebisphenol (bisphenol A), isopropylidenebis (orthocresol) etc.

It is preferable that the modified polyamine (c1) used in the present invention is the modified polyamine obtained by carrying out the reaction of the component (c1-2) having an epoxy equivalent of 0.5-2, in particular 0.8-1.5, with 1 mol of component (c1-1).

Additionally, different modified amine compounds and/or imidazole compounds can be used in combination as the component (c1-1). For example, a modified amine obtained by using a polyamine corresponding to the above (1) and an imidazole compound can be used in combination.

A phenol resin of the component (c2) used in the present invention is a phenol resin synthesized from phenols and aldehydes. Examples of the above phenols are phenol, cresol, ethylphenol, n-propylphenol, iso-propylphenol, butylphenol, tert-butylphenol, octylphenol, nonylphenol, dodecylphenol, cyclohexylphenol, chlorophenol, bromophenol, resorcin, catechol, hydroquinone, 2,2-bis(4-hydroxyphenyl) propane, 4,4'-thiodiphenol, dihydroxydiphenylmethane, naphthol, terpene phenol, phenolized di cyclopentadiene etc. The example of the above aldehydes is formaldehyde.

In particular, it is preferable to use the phenol resin (c2) having 750~1,200 of number average molecular weight from a viewpoint of obtaining excellently balanced storage stability and curing properties in the present invention.

It is preferable that the quantity of the component (c2) used is 10~100 mass parts relative to 100 mass parts of the component (c1), in particular 20~60 mass parts is more preferable. When the quantity of the component (c2) used is less than 10 mass parts, sufficient curing properties may not be obtained. When it is more than 100 mass parts, the physical properties of the hardened material deteriorate.

Examples of polycarboxylic acid (c3) used for the present invention are adipic acid, glutaric acid, pimelic acid, suberic acid, sebacic acid, dodecane diacid, azelaic acid, maleic acid, itaconic acid, phthalic acid, isophthalic acid, terephthalic acid, trimellitic acid, pyromellitic acid etc. In addition, ester-containing compounds of a terminal carboxylic group which is obtained by the esterification of addition compound between acid anhydride and polyol can also be used as the component (c3). Examples of such ester-containing compounds are phthalic anhydride/ethylene glycol=1/1 mol addition compound, tetrahydrophthalic anhydride/propylene glycol=1/1 mol addition compound etc.

It is preferable that the quantity of the component (c3) used is 0.5~50 mass parts relative to 100 mass parts of the component (c1), in particular 1~20 mass parts is more preferable. When the component (c3) is less than 0.5 mass parts, storage stability is poor. When it is more than 50 mass parts, the curing properties deteriorate significantly.

As for the quantity of component (A) and (B) used in one liquid type cyanate-epoxy composite resin composition of the present invention, it is preferable that component (B) is 1~10, 000 mass parts relative to 100 mass parts of component (A). In particular, 10~1,000 mass parts is more preferable and 20~500 mass parts is the most preferable.

As for the quantity of component (C) used in one liquid type cyanate-epoxy composite resin composition of the present invention, it is preferable that component (C) is 1~100 mass parts relative to the total quantity of 100 mass parts of component (A) and (B). 5~60 mass parts is more preferable.

Furthermore, it is preferable that the total quantity of components (A), (B) and (C) is 50 or more mass % in one liquid type cyanate-epoxy composite resin composition of the present invention.

One liquid type cyanate-epoxy composite resin composition of the present invention can be dissolved in various types of solvents in use in order to make its treatment easy. Examples of these solvents are ethers such as tetrahydrofuran, 1,2-dimethoxyethane, 1,2-diethoxyethane etc.; alcohols such as iso- or n-buthanol, iso- or n-propanol, amyl alcohol, benzyl alcohol, furfuryl alcohol, tetrahydro furfuryl alcohol etc.; ketones such as methyethylketone, methylisopropylketone, methylbutylketone etc.; aromatic hydrocarbons such as benzen, toluene, xylene etc.; triethylamine, pyridine, dioxane, and acetonitrile etc.

It is preferable that the quantity of the above organic solvents used is 0~40 mass parts relative to the total quantity of 100 mass parts of component (A), (B) and (C). 0~20 mass parts is more preferable. These solvents are volatile and harmful as well as dangerous, therefore, the quantity used more than 200 mass parts is not preferable.

One liquid type cyanate-epoxy composite resin composition of the present invention can be suitably used as adhesive agents and sealing materials. In this case, they may contain fillers or pigments such as glass fiber, carbon fiber, cellulose, silica sand, cement, kaolin, clay, aluminum hydroxide, bentonite, talk, silica, fine powder silica, titanium dioxide, carbon black, graphite, iron oxide, bituminous substance etc.; thickeners; thixotropic agents; flame retardants; defoamers; rust preventive; commonly used additives such as colloidal silica, colloidal alumina etc. and further sticky resins such as xylene resin, petroleum resin etc. may be used in combination, if necessary.

One liquid type cyanate-epoxy composite resin composition of the present invention turns to a hardened material by curing. The hardened material can be manufactured by such a method known in the art as casting the one liquid type cyanate-epoxy composite resin composition of the present invention into a mold and harden it under a common condition.

One liquid type cyanate-epoxy composite resin composition of the present invention will now be described in more detail referring to Manufacturing Examples and Examples, but the present invention should not be limited by these descriptions.

Manufacturing Example 1

Manufacture of Latent Curing Agent (EH-1)

352 g of isophoronediamine was introduced into a flask and heated to 60° C., then 580 g of ADEKA RESIN EP-4100E (Commercial name of product manufactured by ADEKA CORPORATION; it is a bisphenol A type epoxy resin, and its epoxy equivalent is 190) [the epoxy equivalent of ADEKA RESIN EP-4100E was 1.47 relative to 1 mol of isophoronediamine] was added little by little in order to keep the inner temperature of the reaction system at 100~110° C. After ADEKA RESIN EP-4100E was added, the temperature of the reaction system was risen to 140° C., the reaction was carried out for 1.5 hours to obtain modified polyamine. Then, 20 g of phenol resin and 5 g of sebacic acid were introduced into 100 g of modified polyamine obtained, and heated for an hour under the condition of 150~160° C. to melt, then the latent curing agent (EH-1) was obtained.

Manufacturing Example 2

Manufacture of Latent Curing Agent (EH-2)

201 g of 1,2-diaminopropane was introduced into a flask and heated to 60° C., then 580 g of ADEKA RESIN EP-4100E (Commercial name of product manufactured by ADEKA CORPORATION; it is a bisphenol A type epoxy resin, and its epoxy equivalent is 190) [the epoxy equivalent of ADEKA RESIN EP-4100E was 1.12 relative to 1 mol of 1,2-diaminopropane] was added little by little in order to keep the inner temperature of the reaction system at 100~110° C. After ADEKA RESIN EP-4100E was added, the temperature of the reaction system was risen to 140° C., the reaction was carried out for 1.5 hours to obtain modified polyamine. Then, 20 g of phenol resin and 5 g of sebacic acid were introduced into 100 g of modified polyamine obtained, and heated for an hour under the condition of 150~160° C. to melt, then the latent curing agent (EH-2) was obtained.

Manufacturing Example 3

Manufacture of Latent Curing Agent (EH-3)

352 g of isophoronediamine was introduced into a flask and heated to 60° C., then 580 g of ADEKA RESIN EP-4100E (Commercial name of product manufactured by ADEKA CORPORATION, it is a bisphenol A type epoxy resin, and its epoxy equivalent is 190) [the epoxy equivalent of ADEKA RESIN EP-4100E was 1.53 relative to 1 mol of isophoronediamine] was added little by little in order to keep the inner temperature of the reaction system at 100~110° C. After ADEKA RESIN EP-4100E was added, the temperature of the reaction system was risen to 140° C., the reaction was carried out for 1.5 hours to obtain modified polyamine. Then, 20 g of phenol resin and 8 g of adipic acid were introduced into 100 g of modified polyamine obtained, and heated for an hour under the condition of 150~160° C. to melt, then the latent curing agent (EH-3) was obtained.

Manufacturing Example 4

Manufacture of Latent Curing Agent (EH-4)

352 g of isophoronediamine was introduced into a flask and heated to 60° C., then 580 g of ADEKA RESIN EP-4100E (Commercial name of product manufactured by ADEKA CORPORATION; it is a bisphenol A type epoxy resin, and its epoxy equivalent is 190) [the epoxy equivalent of ADEKA RESIN EP-4100E was 1.53 relative to 1 mol of isophoronediamine] was added little by little in order to keep the inner temperature of the reaction system at 100~110° C. After ADEKA RESIN EP-4100E was added, the temperature of the reaction system was risen to 140° C., the reaction was carried out for 1.5 hours to obtain modified polyamine. Then, 30 g of phenol resin was introduced into 100 g of modified polyamine obtained, and heated for an hour under the condition of 150~160° C. to melt, then the latent curing agent (EH-4) was obtained.

Manufacturing Example 5

Manufacture of Latent Curing Agent (EH-5)

201 g of 1,2-diaminopropane was introduced into a flask and heated to 60° C., then 580 g of ADEKA RESIN EP-4100E (Commercial name of product manufactured by ADEKA CORPORATION; it is a bisphenol A type epoxy resin, and its epoxy equivalent is 190) [the epoxy equivalent of ADEKA RESIN EP-4100E was 1.12 relative to 1 mol of 1,2-diaminopropane] was added little by little in order to keep the inner temperature of the reaction system at 100~110° C. After ADEKA RESIN EP-4100E was added, the temperature of the reaction system was risen to 140° C., the reaction was carried out for 1.5 hours to obtain modified polyamine. Then, 30 g of phenol resin was introduced into 100 g of modified polyamine obtained, and heated for an hour under the condition of 150~160° C. to melt, then the latent curing agent (EH-5) was obtained.

Example 1 and Comparative Example 1

Cyanate ester resin (Cyanate LeCy; commercial name of product manufactured by Lonza Ltd.: it is represented as CE in Tables 1 and 2), epoxy resin (EP-4910E; commercial name of product manufactured by ADEKA CORPORATION; bisphenol F type epoxy resin and its epoxy equivalent is 168: it is represented as EP in Tables 1 and 2.) and the latent curing agent obtained by the above manufacturing examples were combined to manufacture the resin composition. The tests of the obtained resin compositions were carried out as follows. The blending quantity of each component and the results are shown in Tables 1~2 together.

The results are shown in Tables 1~2.

1. Viscosity

Viscosity per 1 rpm at 25° C. was measured by using Brookfield E type rotation viscometer.

2. Gel time 0.5 g of the composition obtained was dropped on the heated plate where each measured temperature was maintained. Mixing with a spatula, the time until the fluidity is lost was measured.

3. Differential Scanning Calorimetry

The DSC chart was obtained under the condition of 10° C./minute of temperature rising speed and 25-300° C. of scanning temperature range by using the differential scanning calorimeter DSC 6220 manufactured by SII Nano Technology Inc. Then the secondary temperature rising was carried out under the same condition, and the glass transition point was measured from the change of heat capacity.

4. Adhesive Properties

According to JIS K 6850, after heating for 30 minutes at 100° C., then heating for 1 hour at 150° C. for curing, and shear adhesive strength between two steel plates was measured.

TABLE 1

| | Examples | | | | | |
|---|---|---|---|---|---|---|
| | 1-1 | 1-2 | 1-3 | 1-4 | 1-5 | 1-6 |
| Composition (g) | | | | | | |
| CE | 50 | 50 | 50 | 50 | 50 | 50 |
| EP | 50 | 50 | 50 | 50 | 50 | 50 |
| EH-1 | 55 | 27.5 | | | | |
| EH-2 | | | 55 | 27.5 | | |
| EH-3 | | | | | 55 | 27.5 |
| EH-4 | | | | | | |
| EH-5 | | | | | | |
| Evaluation results Viscosity | | | | | | |
| Initial viscosity (mPa·s) | 8220 | 884 | 8100 | 854 | 8420 | 887 |
| Thickening ratio | | | | | | |
| 25° C. × 24 h | 101 | 100 | 102 | 100 | 100 | 100 |
| 25° C. × 168 h | 97 | 101 | 100 | 104 | 100 | 101 |
| 25° C. × 360 h | 100 | 90 | 98 | 97 | 95 | 97 |
| 25° C. × 672 h | 102 | 95 | 101 | 100 | 103 | 97 |
| Gel time (min. or | | | | | | |
| 80° C. | 31 sec | 25 sec | 38 sec | 43 sec | 30 sec | 27 sec |
| 100° C. | 12 sec | 10 sec | 11 sec | 12 sec | 11 sec | 11 sec |
| 120° C. | 10 sec | 9 sec | 9 sec | 10 sec | 11 sec | 11 sec |
| DSC | | | | | | |
| Start of heating (° C.) | 107.5 | 108.3 | 89.4 | 98.8 | 107.5 | 108.3 |
| gross heating value (mJ/mg) | 467 | 608 | 570 | 658 | 477 | 628 |
| Tg (° C.) | 108.3 | 120.4 | 106.0 | 119.8 | 108.7 | 119.3 |
| Adhesion (MPa) | 16.7 | 15.8 | 16.9 | 16.2 | 16.8 | 15.4 |

TABLE 2

| | Comparative examples | | | | | |
|---|---|---|---|---|---|---|
| | 1-1 | 1-2 | 1-3 | 1-4 | 1-5 | 1-6 |
| Composition (g) | | | | | | |
| CE | 50 | 50 | 50 | 50 | | |
| EP | 50 | 50 | 50 | 50 | 100 | 100 |
| EH-1 | | | | | 55 | |
| EH-2 | | | | | | 55 |
| EH-3 | | | | | | |
| EH-4 | 55 | 27.5 | | | | |
| EH-5 | | | 55 | 27.5 | | |
| Evaluation results Viscosity | | | | | | |
| Initial viscosity (mPa·s) | 7670 | 809 | 8550 | 980 | 16120 | 17600 |
| Thickening ratio (%) | | | | | | |
| 25° C. × 24 h | 101 | 100 | 101 | 100 | 125 | 138 |
| 25° C. × 168 h | 100 | 98 | 97 | 95 | 123 | 121 |
| 25° C. × 360 h | 93 | 92 | 101 | 101 | 131 | 135 |
| 25° C. × 672 h | 106 | 91 | 104 | 101 | 126 | 130 |
| Gel time (min. or sec.) | | | | | | |
| 80° C. | >10 min | >10 min | >10 min | >10 min | 6 min 38 sec | 5 min 45 sec |
| 100° C. | 10 sec | 11 sec | 13 sec | 14 sec | 1 min 12 sec | 1 min 20 sec |
| 120° C. | 09 sec | 10 sec | 13 sec | 14 sec | 42 sec | 55 sec |
| DSC | | | | | | |
| Start of heating (° C.) | 104.5 | 105.5 | 87.2 | 91.0 | 66.1 | 64.7 |
| gross heating value (mJ/mg) | 450 | 627 | 552 | 655 | 266 | 234.3 |
| Tg (° C.) | 101.5 | 115.7 | 105.2 | 117.4 | 57.7 | 56.9 |
| Adhesion (MPa) | 16.0 | 16.2 | 16.6 | 16.9 | 16.7 | 13.7 |

It was identified by comparing Examples 1-1~1-6 and Comparative Examples 1-1~1-4 with Comparative examples 1-5 and 1-6 that the following effects were seen by combining the epoxy resin(A) and the latent curing agent with the cyanate ester resin (A).
1. Heat resistance properties was improved dramatically since Tg became clearly higher.
2. Treating properties and storage stability were improved dramatically since increasing ratio of tackiness decreased as well as primary viscosity decreased dramatically.

When the latent curing agent not containing polycarboxylic acid (c3) but containing a modified polyamine (c1) which has one or more amino group having an active hydrogen within a molecule and the phenol resin(c2) was used (Comparative Examples 1-1~1-4), the gel time of the obtained resin composition at 80° C. is dearly longer than the gel time of Examples of the present invention. Therefore, in the case of Comparative Examples 1-1~1-4 which do tint contain polycarboxylic acid (c3), it is clear that the curing properties at low temperature are poorer than the curing properties of the resin composition of the present invention.

Thus, it was identified that the resin composition having excellent curing properties at low temperature in particular as well as excellent heat resistance and storage stability can be obtained by combining the latent curing agent (C), which is obtained by the combination of a modified polyamine (c1) which has one or more amine group having an active hydrogen within a molecule, a phenol resin (c2) and a polycarboxylic acid (c3), with the cyanate resin (A) and the epoxy resin (B) (Examples 1-1~1-6).

INDUSTRIAL APPLICABILITY

The cyanate-epoxy resin composition of the present invention can be widely used as a coating composition or as an adhesive agent for concrete, cement, mortar, various types of metal, leather, glass, rubber, plastic, wood, cloth and paper etc. In particular, one liquid type cyanate-epoxy composite resin composition of the present invention has high heat resistance and excellent adhesive properties. Therefore, it can be suitably used for sealing materials to protect semiconductors, electronic materials to bond electronic parts etc. and automobile materials.

The invention claimed is:
1. One liquid cyanate-epoxy composite resin composition comprised of a cyanate ester resin (A), an epoxy resin (B), and a latent curing agent (C), characterized in that the above latent curing agent (C) is composed of a modified polyamine (c1), a phenol resin (c2) and one or more kind of polycarboxylic acid (c3), and the above modified polyamine (c1) is a modified amine which is obtained by the reaction of polyamine compound (c1-1) with epoxy compound (c1-2) and has one or more amino group having an active hydrogen within a molecule.
2. One liquid cyanate-epoxy composite resin composition described in claim 1, wherein the above polyamine compound (c1-1) is at least one kind of polyamine compound selected from groups consisting of diamine (1) and aromatic, alicyclic and aliphatic polyamines (2) having two or more primary or secondary amino groups within a molecule, and the above polyamine (2) is a polyamine having amino groups, in which the reactivity of the remaining primary or secondary amino groups with the epoxy group deteriorates by steric hindrance caused by the first reaction of an amino group with an epoxy group.
3. One liquid cyanate-epoxy composite resin composition described in claim 2, wherein the above polyamine compound (c1-1) is at least one kind of diamine selected from a group consisting of the above diamines (1) having two primary or secondary amino groups, which are different from each other in reactivity, within a molecule.
4. One liquid cyanate-epoxy composite resin composition described in claim 2, wherein the above polyamine compound (c1-1) is at least one kind of polyamine compound selected from a group consisting of aromatic, alicyclic and aliphatic polyamines (2) having two or more primary or secondary amino groups within a molecule.
5. One liquid cyanate-epoxy composite resin composition described in claim 1, wherein the above modified polyamine (c1) is the modified polyamine obtained by reacting 0.5~2 equivalent of the above epoxy compound(c1-2) with 1 mol of the above polyamine compound (c1-1).
6. One liquid cyanate-epoxy composite resin composition described in claim 1, wherein the quantity of the above phenol resin (c2) used is 10-100 mass parts relative to 100 mass parts of the above modified polyamine (c1).
7. One liquid cyanate-epoxy composite resin composition described in claim 1, wherein the quantity of the above polycarboxylic acid (c3) used is 1~50 mass parts relative to 100 mass parts of the above modified polyamine (c1).
8. One liquid cyanate-epoxy composite resin composition described in claim 1, wherein the above polyamine compound (c1-1) is at least one kind of compound selected from 1,2-diaminopropane, -isophorondiamine, methanediamine, m-xylylenediamine, 1,3-bis-aminocyclohexane and N-aminoethylpiperazine.
9. One liquid cyanate-epoxy composite resin composition described in claim 1, wherein the above epoxy compound (c1-2) is a polyglycidyl ether compound having two or more epoxy groups within a molecule.
10. One liquid cyanate-epoxy composite resin composition described in claim 1, wherein the quantity of the above epoxy resin (B) used is 1~10,000 mass parts relative to 100 mass parts of the above cyanate ester resin (A).
11. One liquid cyanate-epoxy composite resin composition described in claim 1, wherein the above cyanate-ester resin (A) is at least one kind of resin selected from a group consisting of the compounds represented by the following formula (1) or following formula (2) and prepolymers thereof;

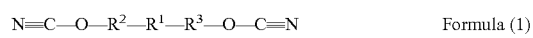

Formula (2)

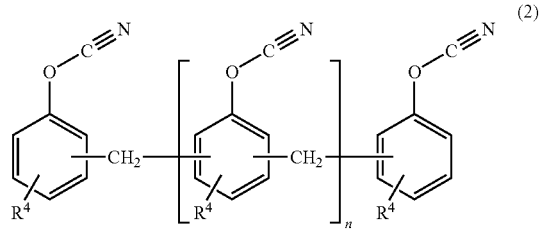

$R^1$ in the above formula (1) is a bivalent unsubstituted or fluorine-substituted hydrocarbon group, $R^2$ and $R^3$ are each an unsubstituted phenylene group or a phenylene group substituted by 1~4 alkyl groups independently;

n in the formula (2) is an integer of 1 or more, $R^4$ is a hydrogen atom or an alkyl group having 1~4 carbon atoms.

12. One liquid cyanate-epoxy composite resin composition described in claim 1, wherein a cyanate ester resin (A) is at least one kind of resin selected from a group consisting of the compounds represented by the following formula (3) and prepolymers thereof;

Formula (3)

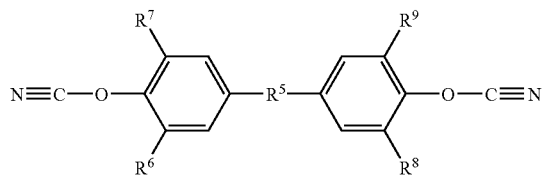

(3)

$R^5$ in the formula is a group represented by

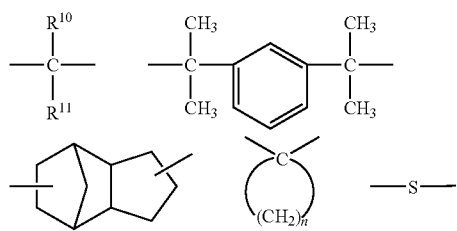

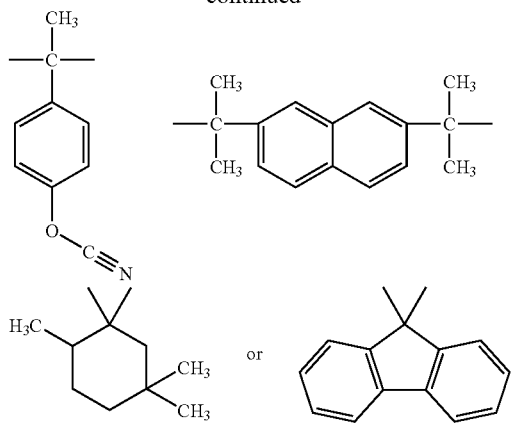

$R^6$, $R^7$, $R^8$ and $R^9$ are each a hydrogen atom or an unsubstituted or fluorine-substituted methyl group independently;

n is an integer of 4~12. $R^{10}$ and $R^{11}$ are each a hydrogen atom or an unsubstituted or fluorine-substituted methyl group independently.

13. A hardened material characterized in that one liquid cyanate-epoxy composite resin composition described in claim 1 is polymerized and cured.

14. A sealing material characterized in that one liquid cyanate-epoxy composite resin composition described in claim 1 is contained.

15. An adhesive agent characterized in that one liquid cyanate-epoxy composite resin composition described in claim 1 is contained.

16. A method of manufacturing a hardened material characterized in that one liquid type cyanate-epoxy composite resin composition described in claim 1 is polymerized and cured in the mold.

* * * * *